(12) United States Patent
Ozawa

(10) Patent No.: US 11,296,108 B2
(45) Date of Patent: Apr. 5, 2022

(54) SEMICONDUCTOR MEMORY DEVICE AND MANUFACTURING METHOD OF SEMICONDUCTOR MEMORY DEVICE

(71) Applicant: KIOXIA CORPORATION, Minato-ku (JP)

(72) Inventor: Ayumu Ozawa, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 137 days.

(21) Appl. No.: 16/529,970

(22) Filed: Aug. 2, 2019

(65) Prior Publication Data
US 2020/0251491 A1 Aug. 6, 2020

(30) Foreign Application Priority Data
Feb. 5, 2019 (JP) .............................. JP2019-018384

(51) Int. Cl.
| | | |
|---|---|---|
| *H01L 27/11582* | (2017.01) | |
| *H01L 27/11556* | (2017.01) | |
| *H01L 23/528* | (2006.01) | |
| *H01L 21/02* | (2006.01) | |
| *H01L 27/11565* | (2017.01) | |
| *H01L 21/027* | (2006.01) | |

(Continued)

(52) U.S. Cl.
CPC .... *H01L 27/11582* (2013.01); *H01L 21/0217* (2013.01); *H01L 21/0274* (2013.01); *H01L 21/02164* (2013.01); *H01L 21/31116* (2013.01); *H01L 21/31144* (2013.01); *H01L 23/528* (2013.01); *H01L 27/11519* (2013.01); *H01L 27/11556* (2013.01); *H01L 27/11565* (2013.01)

(58) Field of Classification Search
CPC .................. H01L 27/11551–11556; H01L 27/11578–11582
See application file for complete search history.

(56) References Cited

U.S. PATENT DOCUMENTS 8,822,285 B2 9/2014 Hwang et al.
2013/0161821 A1* 6/2013 Hwang ............. H01L 27/11556
257/773

(Continued)

FOREIGN PATENT DOCUMENTS

| JP | 2014-138188 A | 7/2014 |
|---|---|---|
| JP | 2017-112378 A | 6/2017 |

(Continued)

*Primary Examiner* — Bryan R Junge
(74) *Attorney, Agent, or Firm* — Oblon, McClelland, Maier & Neustadt, L.L.P.

(57) ABSTRACT

According to one embodiment, a semiconductor memory device includes conductive layers stacked at intervals and extending from a memory cell array region to a contact region. The contact region includes a staircase contact region and a staircase connection region. The staircase contact region includes a descending step contact region with steps descending in a first direction away from the memory cell array region and an ascending step contact region with steps ascending in the first direction, and the descending step contact region and the ascending step contact region include terrace faces provided with respective contacts connected thereto. The staircase connection region includes conductive layers formed of layers same as conductive layers connected to the contacts of the ascending step contact region.

22 Claims, 13 Drawing Sheets

(51) Int. Cl.
*H01L 21/311* (2006.01)
*H01L 27/11519* (2017.01)

(56) References Cited

U.S. PATENT DOCUMENTS

| | | | |
|---|---|---|---|
| 2014/0162420 A1* | 6/2014 | Oh | H01L 27/11582 |
| | | | 438/270 |
| 2014/0197546 A1 | 7/2014 | Hwang et al. | |
| 2016/0111361 A1* | 4/2016 | Oh | H01L 27/11578 |
| | | | 257/390 |
| 2016/0233229 A1* | 8/2016 | Oh | H01L 27/11548 |
| 2017/0033117 A1* | 2/2017 | Lee | H01L 27/11524 |
| 2017/0040254 A1 | 2/2017 | Hwang et al. | |
| 2017/0141032 A1 | 5/2017 | Lee | |
| 2017/0179028 A1 | 6/2017 | Lee et al. | |
| 2017/0256551 A1* | 9/2017 | Lee | H01L 27/11582 |
| 2017/0294383 A1* | 10/2017 | Tanzawa | H01L 27/11582 |
| 2018/0061701 A1 | 3/2018 | Miyano | |
| 2019/0019723 A1 | 1/2019 | Miyano | |
| 2020/0135749 A1* | 4/2020 | Hwang | H01L 27/11575 |
| 2020/0227434 A1* | 7/2020 | Lee | H01L 23/5226 |

FOREIGN PATENT DOCUMENTS

| | | |
|---|---|---|
| JP | 2018-037513 A | 3/2018 |
| TW | I630709 B | 7/2018 |

\* cited by examiner

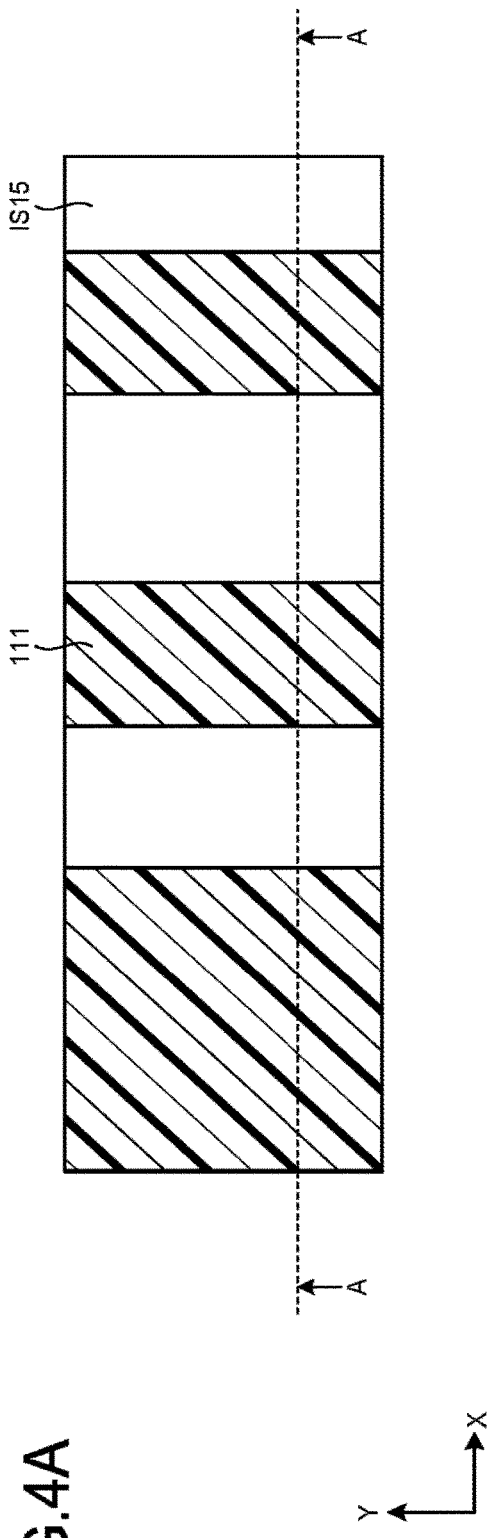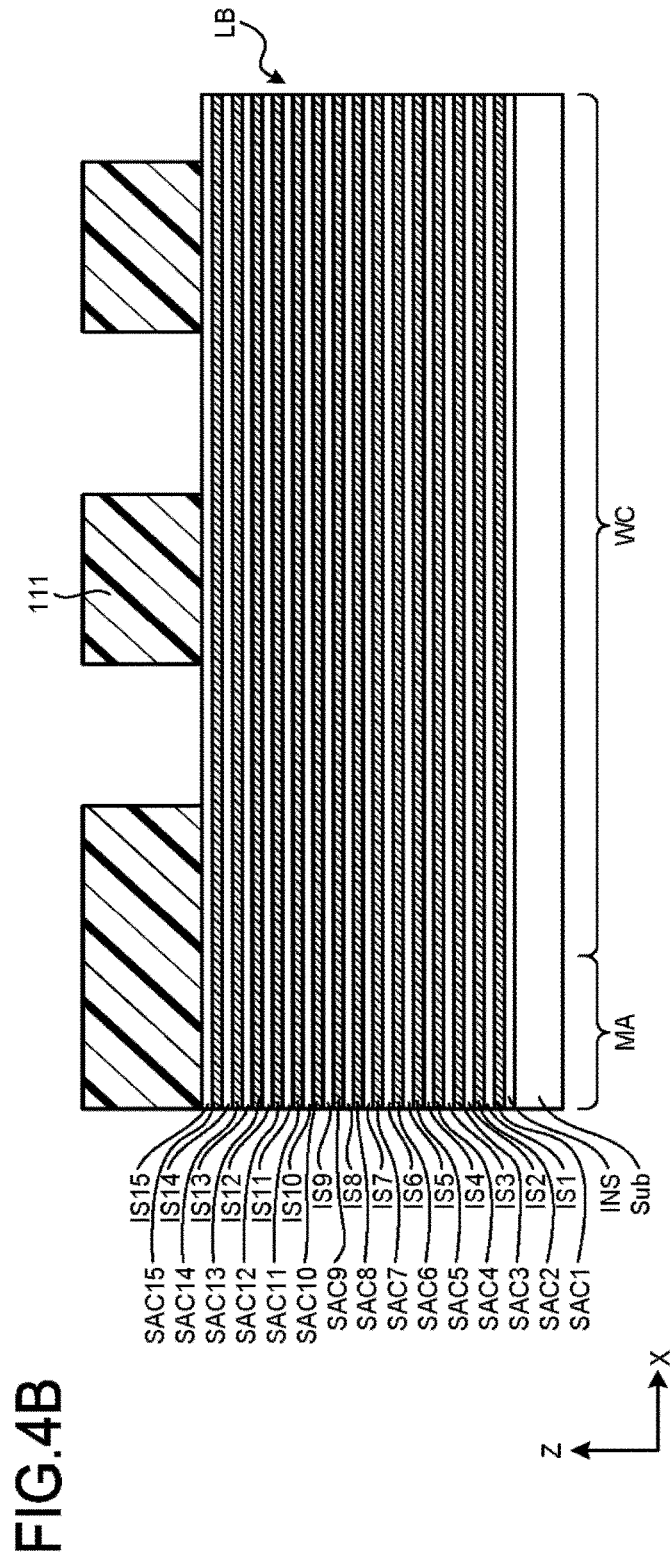
FIG.4A
FIG.4B

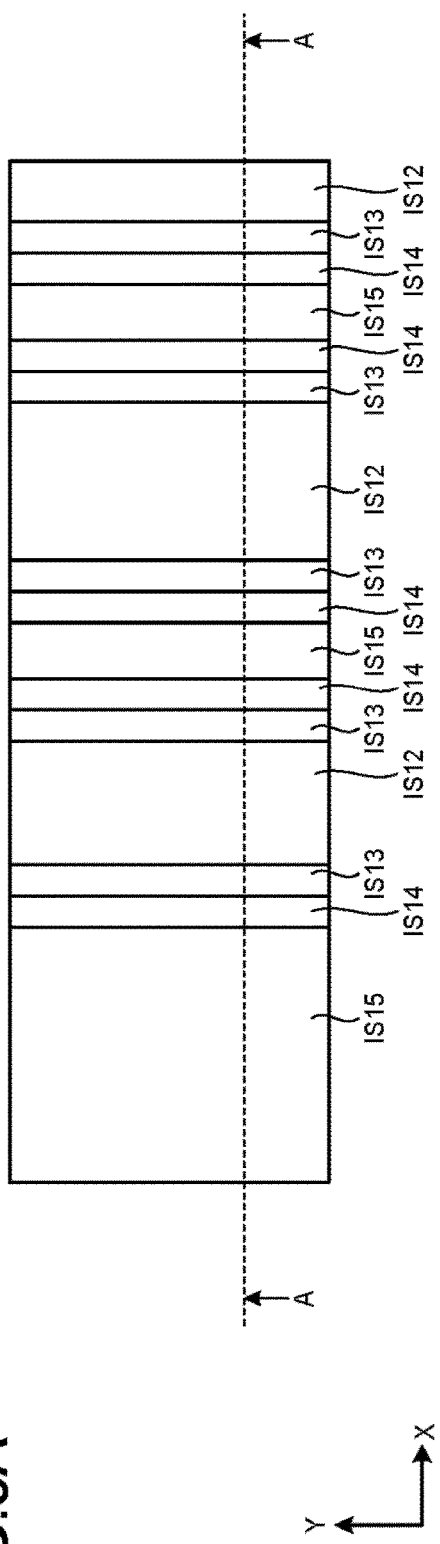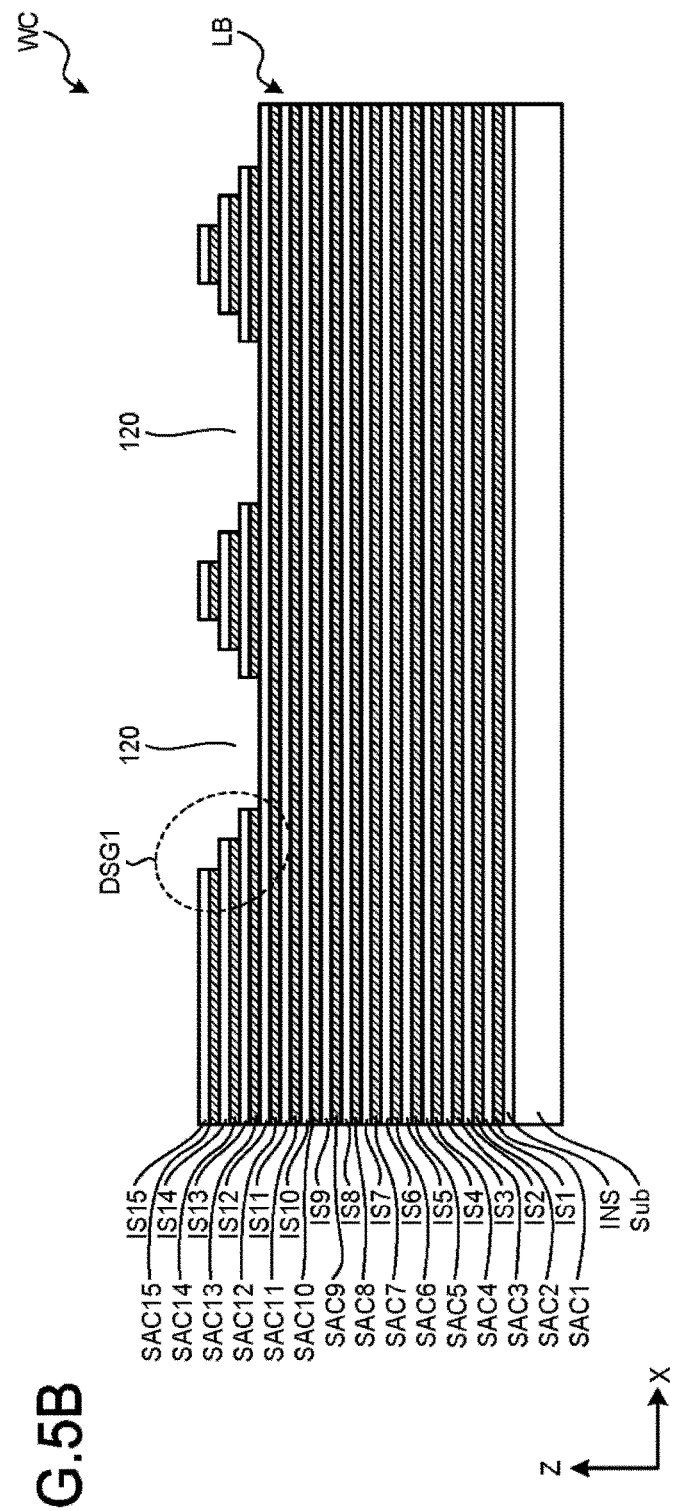

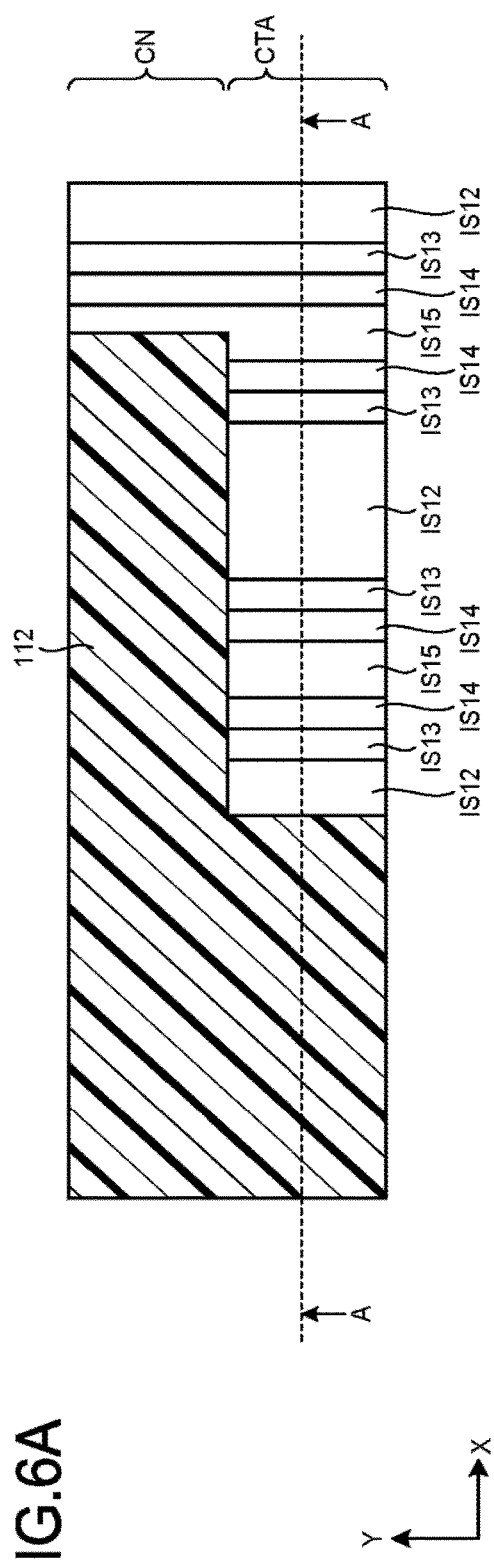
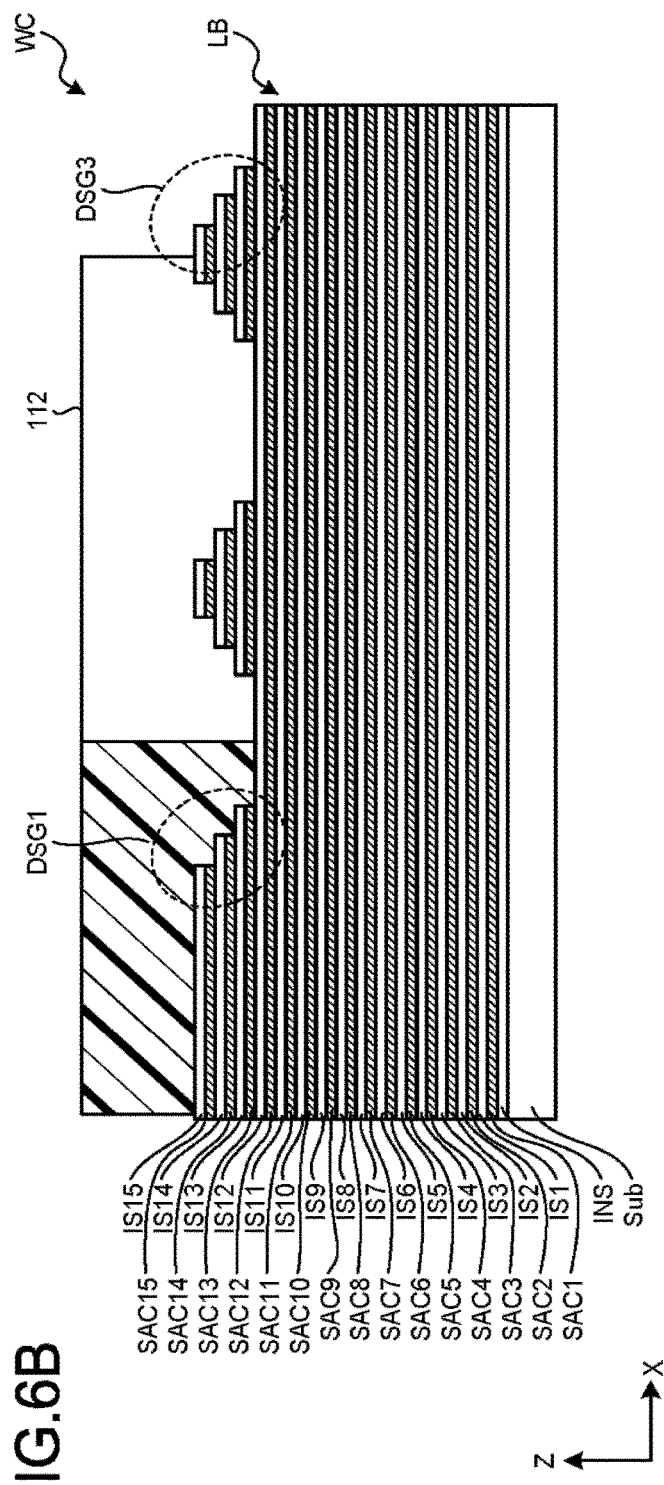

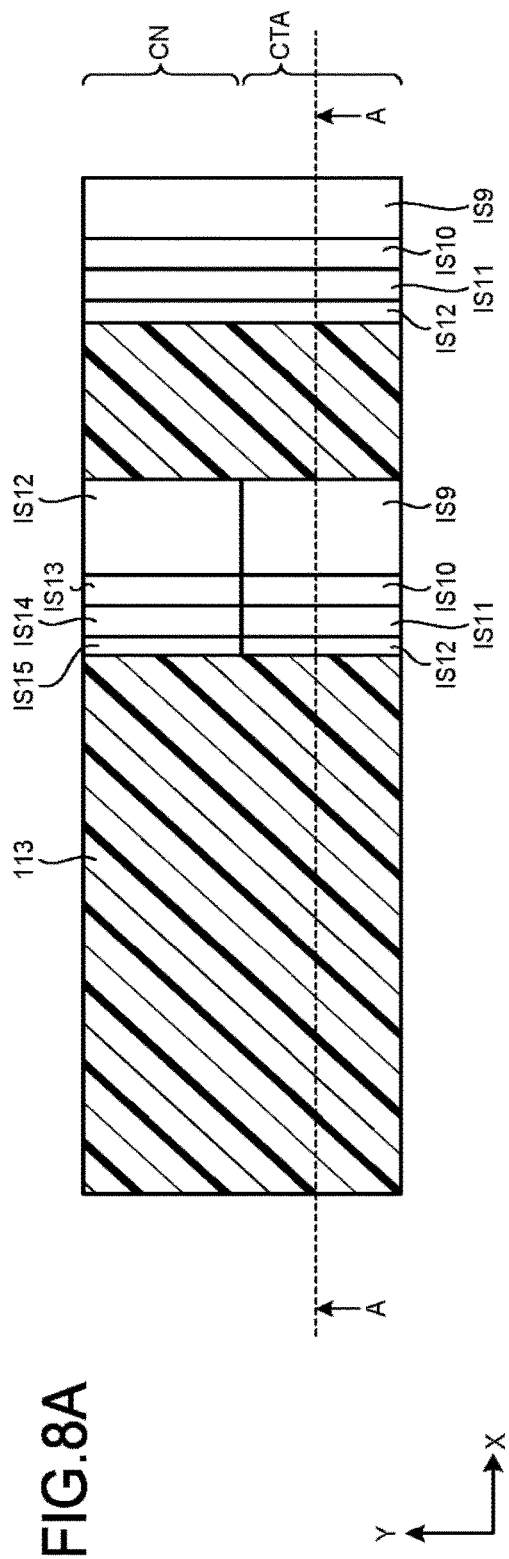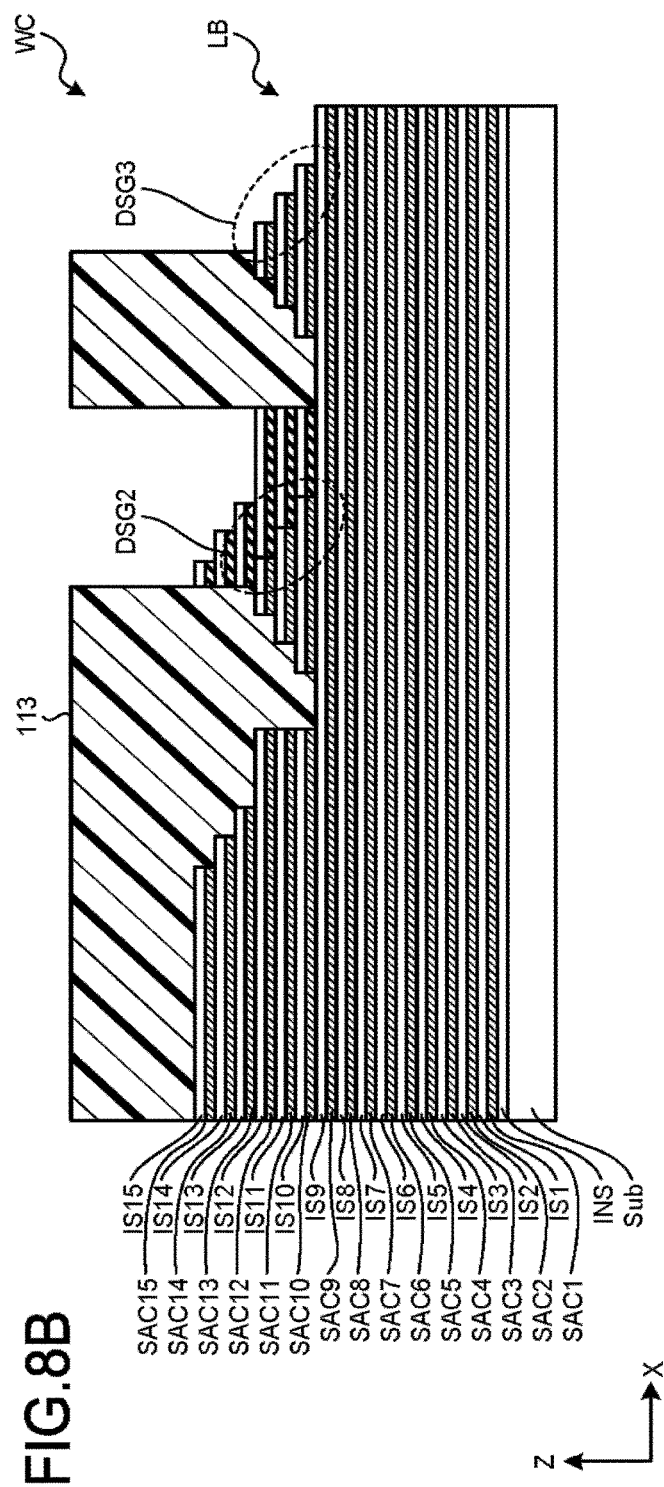

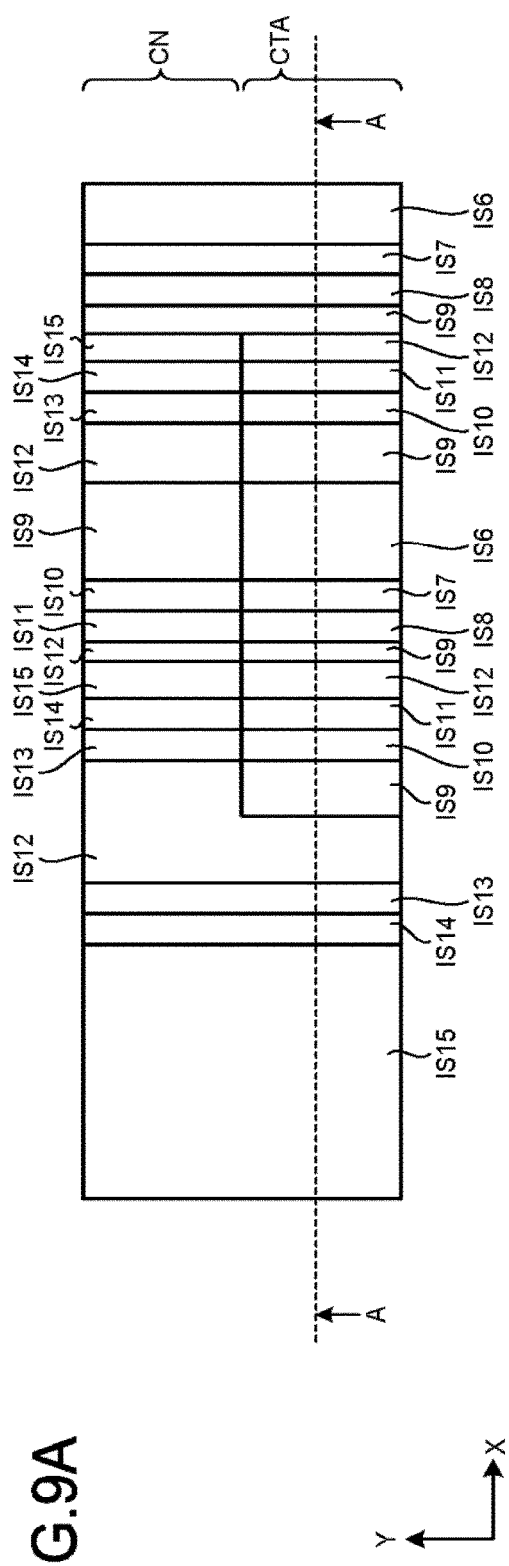
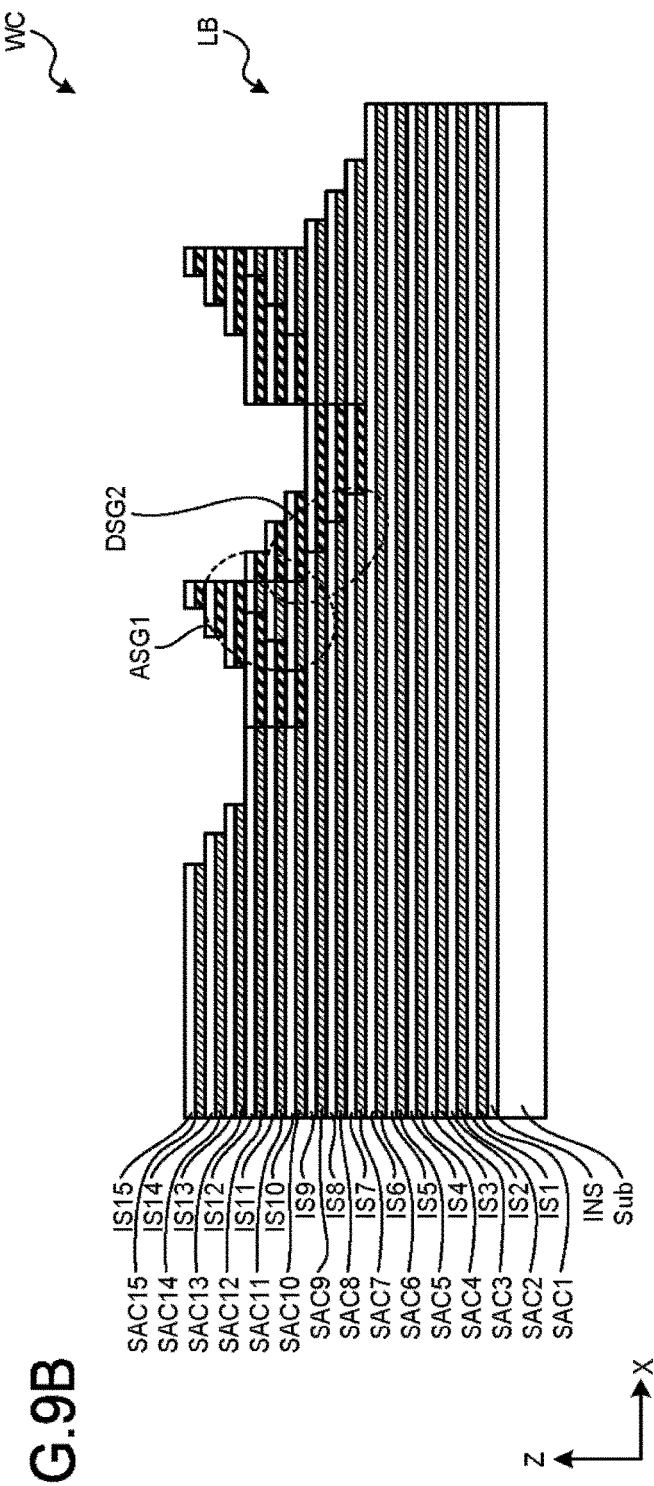
FIG.9A
FIG.9B

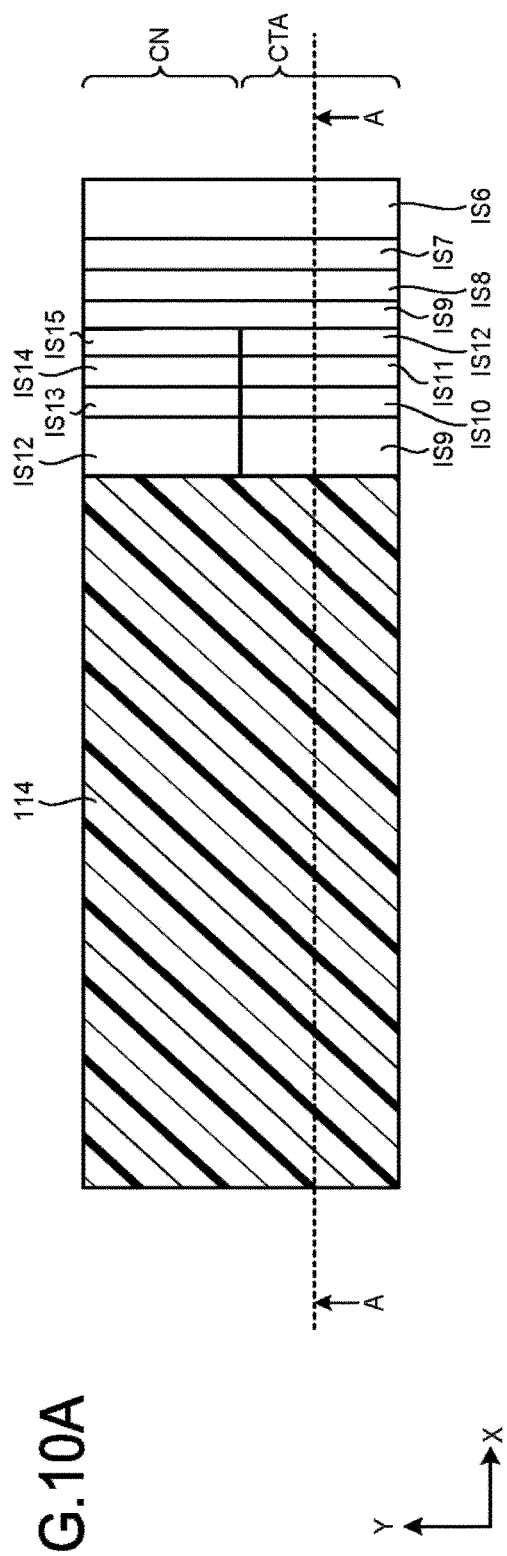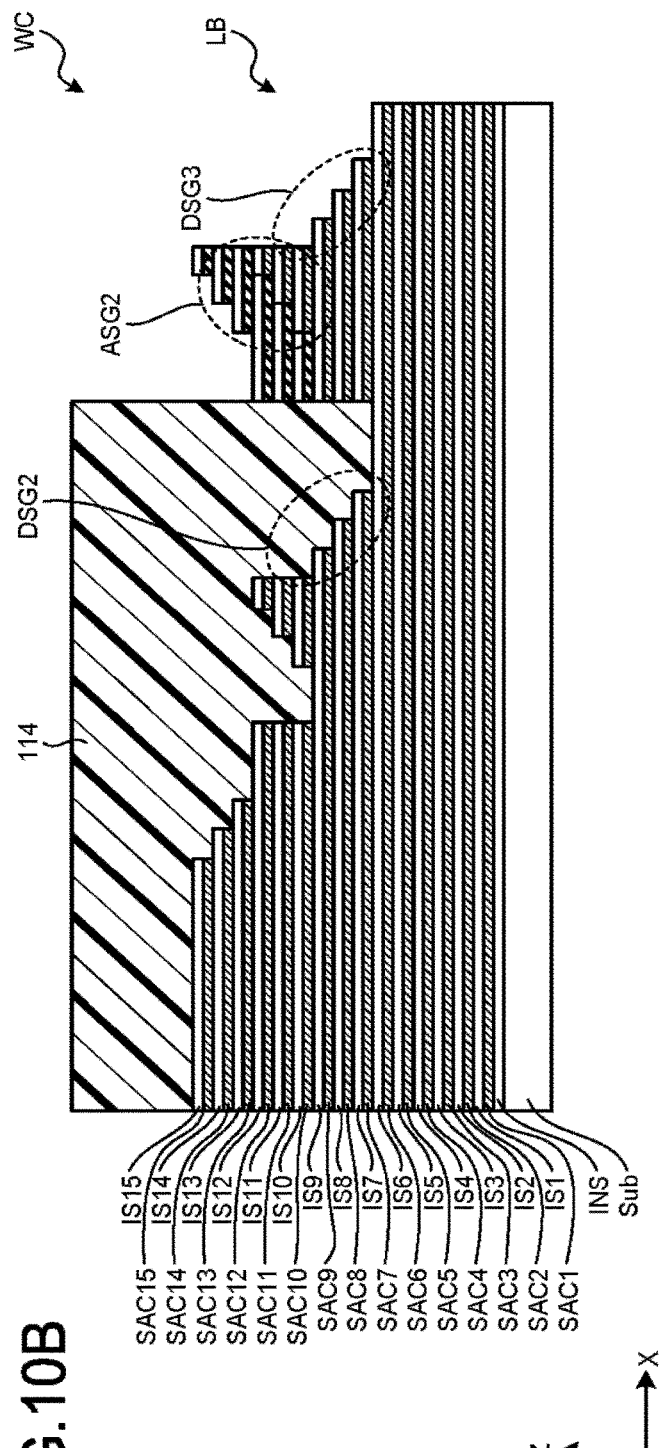

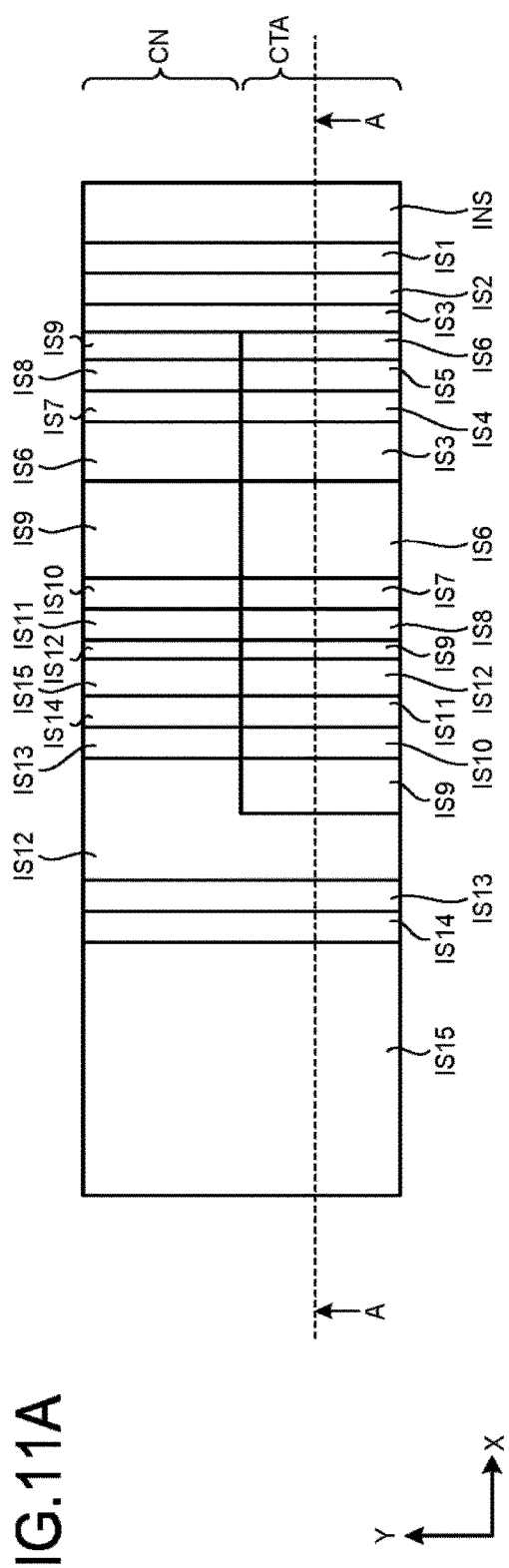
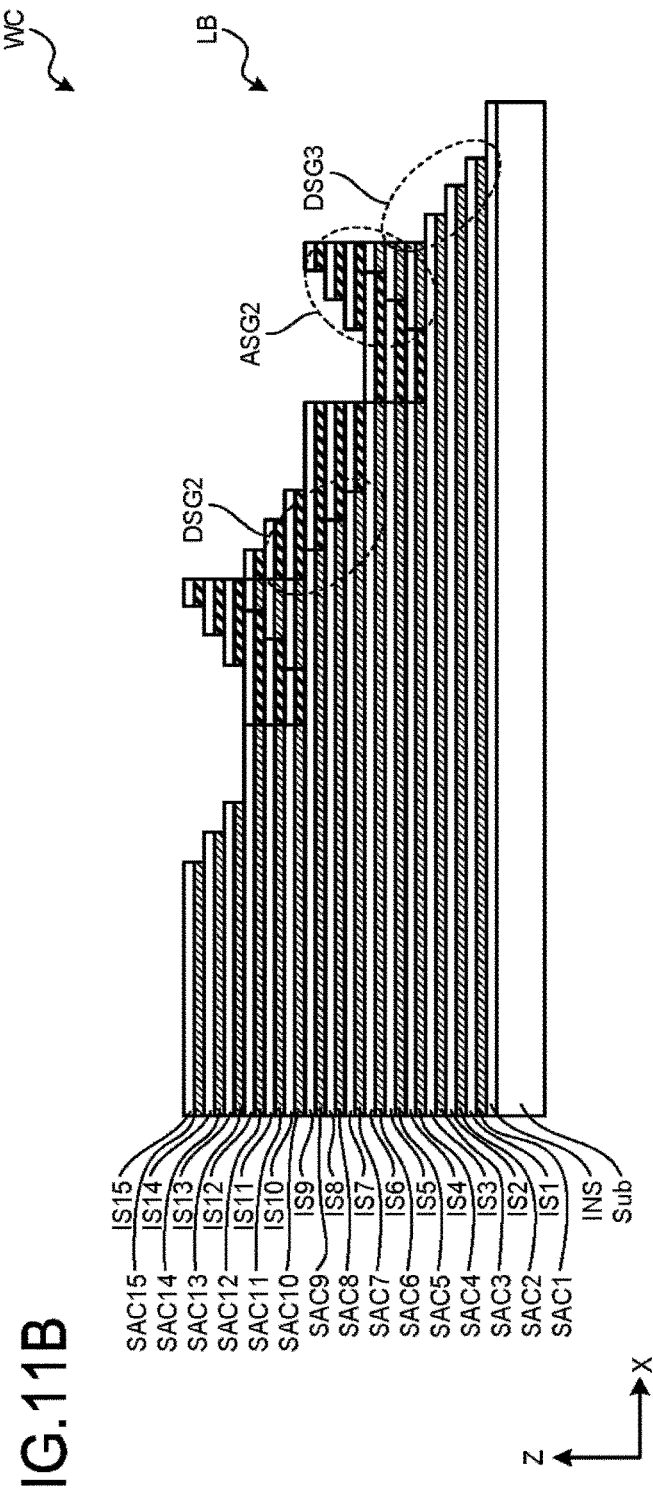

SEMICONDUCTOR MEMORY DEVICE AND MANUFACTURING METHOD OF SEMICONDUCTOR MEMORY DEVICE

CROSS-REFERENCE TO RELATED APPLICATIONS

This application is based upon and claims the benefit of priority front Japanese Patent Application No. 2019-18384, filed on Feb. 5, 2019; the entire contents of which are incorporated herein by reference.

FIELD

An embodiment described herein relates generally to a semiconductor memory device and a manufacturing method of a semiconductor memory device.

BACKGROUND

As a semiconductor memory device, a nonvolatile memory of a three-dimensional multilayer type has been proposed which includes memory cells of a stacked structure. In the nonvolatile memory of a three-dimensional multilayer type, there is a case where a stepwise structure is formed on a contact part for leading out word lines from respective layers of memory cells arranged in the height direction.

BRIEF DESCRIPTION OF THE DRAWINGS

FIGS. 4A to 11B are diagrams illustrating an example of procedures of a manufacturing method of a semiconductor memory device according to the embodiment, in which FIGS. 4A, 5A, 6A, 7A, 8A, 9A, 10A, and 11A are top views, and FIGS. 4B, 5B, 6B, 7B, 8B, 9B, 10B, and 11B are sectional views taken along a line A-A of FIGS. 4A, 5A, 6A, 7A, 8A, 9A, 10A, and 11A, respectively;

DETAILED DESCRIPTION

In general, according to one embodiment, a semiconductor memory device includes a memory cell array region and a contact region. The semiconductor memory device further includes conductive layers stacked at intervals and extending from the memory cell array region to the contact region. The contact region includes staircase contact region and a staircase connection region. The staircase contact region includes a descending step contact region with steps descending in a first direction away from the memory cell array region and an ascending step contact region with steps ascending in the first direction away from the memory cell array region, and the descending step contact region and the ascending step contact region include terrace faces provided with respective contacts connected thereto. The staircase connection region includes conductive layers formed of layers same as conductive layers connected to the contact of the ascending step contact region.

An exemplary embodiment of a semiconductor memory device and a manufacturing method of a semiconductor memory device will be explained below in detail with reference to the accompanying drawings. The present invention is not limited to the following embodiment. The sectional views of a semiconductor memory device used in the following embodiment are schematic, and so the relationship between the thickness and width of each layer and/or the thickness ratios between respective layers may be different from actual states. Further, hereinafter, the semiconductor memory device will be exemplified by a nonvolatile memory having a three-dimensional structure.

For example, a contact part has been proposed which has a configuration provided with first and second staircase parts opposed to each other, such that the first staircase part includes steps descending in a direction away from memory cells, and the second staircase part includes steps ascending in this direction.

However, in such the contact part, the first staircase part is electrically connected to the memory cells, but the second staircase part is not electrically connected to the memory cells. For this reason, only the first staircase part is used for arrangement of contacts, and the area of the contact part becomes larger than necessary.

Figure 1:
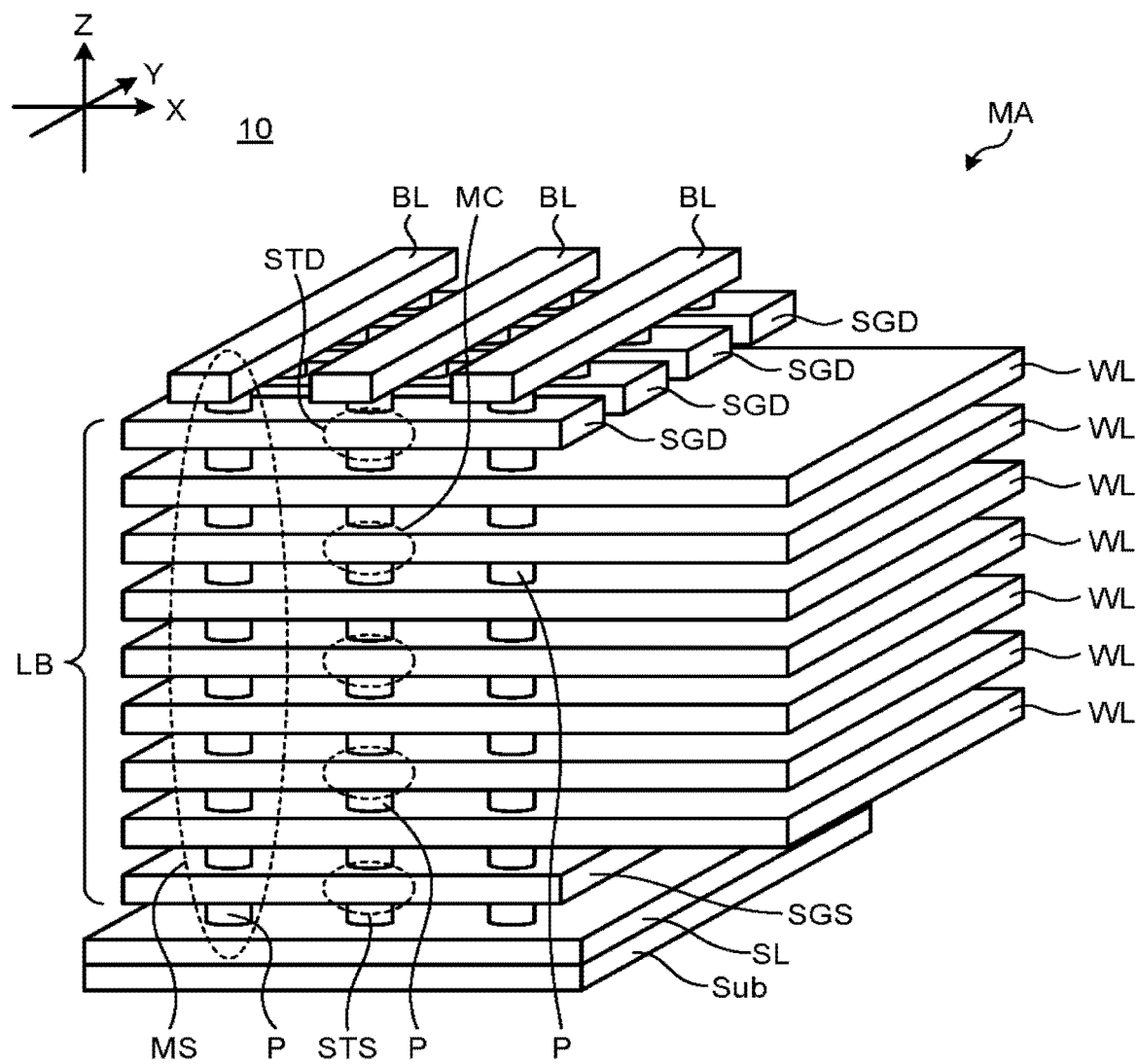
FIG. 1 is a diagram schematically illustrating a configuration example of a nonvolatile memory according to an embodiment.

FIG. 1 is a diagram schematically illustrating a configuration example of a nonvolatile memory according to an embodiment. In FIG. 1, it is assumed that two directions parallel to the main face of a substrate Sub and orthogonal to each other are an X-direction and a Y-direction. Further, it is assumed that a direction orthogonal to both of the X-direction and the Y-direction is a Z-direction (stacking direction). Further, it is assumed that, with respect to the paper face of FIG. 1, a direction from left to right is the positive direction of the X-direction, a direction from front to back is the positive direction of the Y-direction, and a direction from bottom to top is the positive direction of the Z-direction. Here, FIG. 1 omits illustration of interlayer insulating layers or the like.

As illustrated in FIG. 1, on the substrate Sub of the nonvolatile memory 10, which is the semiconductor memory device, a source line SL formed of a conductive layer is provided. On the source line SL, a plurality of pillars P made of silicon oxide or the like are provided and extend in the Z-direction. Each of the pillars P includes, on its own lateral side, a channel layer made of poly-silicon or the like and a memory layer formed of a plurality of stacked insulating layers. For example, the insulating layers form a configuration such that a tunnel insulating film, a charge accumulation film, and a block insulating film are stacked in this order from the channel layer side. Further, a stacked body LB is provided on the source line SL, through an interlayer insulating layer (not illustrated), such that conductive layers made of tungsten or the like and insulating layers made of silicon oxide or the like are stacked alternately one by one. The respective pillars P extend through the stacked body LB.

In the stacked body LB, the lowermost one of the conductive layers serves as a source-side selection gate line SGS, and the uppermost one of the conductive layers serves as a drain-side selection gate line SGD. The selection gate line SGD is divided into lines each for a plurality of pillars P arranged in the X-direction. A plurality of conductive layers interposed between the selection gate lines SGS and SGD serve as a plurality of word lines WL. The number of stacked word lines WL illustrated in FIG. 1 is a mere example. The insulating layers between the selection gate lines SGS and SGD and the plurality of word lines WL serve as interlayer insulating layers (not illustrated).

The respective pillars P are connected to bit lines BL provided above the stacked body LB. Each of the bit lines BL is connected to a plurality of pillars P arranged in the Y-direction.

With the configuration described above, memory cells MC are arranged in the height direction of the pillars, at the connecting portions between the respective pillars P and the word lines WL of respective layers. Further, source-side selection transistors STS and drain-side selection transistors STD are formed at the connecting portions between the respective pillars P and the selection gate lines SGS and SGD, respectively. A selection transistor STS, a plurality of memory cells MC, and a selection transistor STD arranged in the height direction of each of the pillars P compose a memory string MS. Further, the memory cells MC arranged in a three-dimensional state and in a matrix shape, as described above, constitute a memory cell array MA. The memory cell array MA may also be referred to a "memory cell array region".

The selection gate lines SGS and SGD and the plurality of word lines WL are led out of the memory cell array MA, and form a contact part having stepwise structures. In this example, it is assumed that the contact part is arranged on the positive side of the X-direction from the memory cell array MA. The contact part may also be referred to as "contact region".

Figure 2:
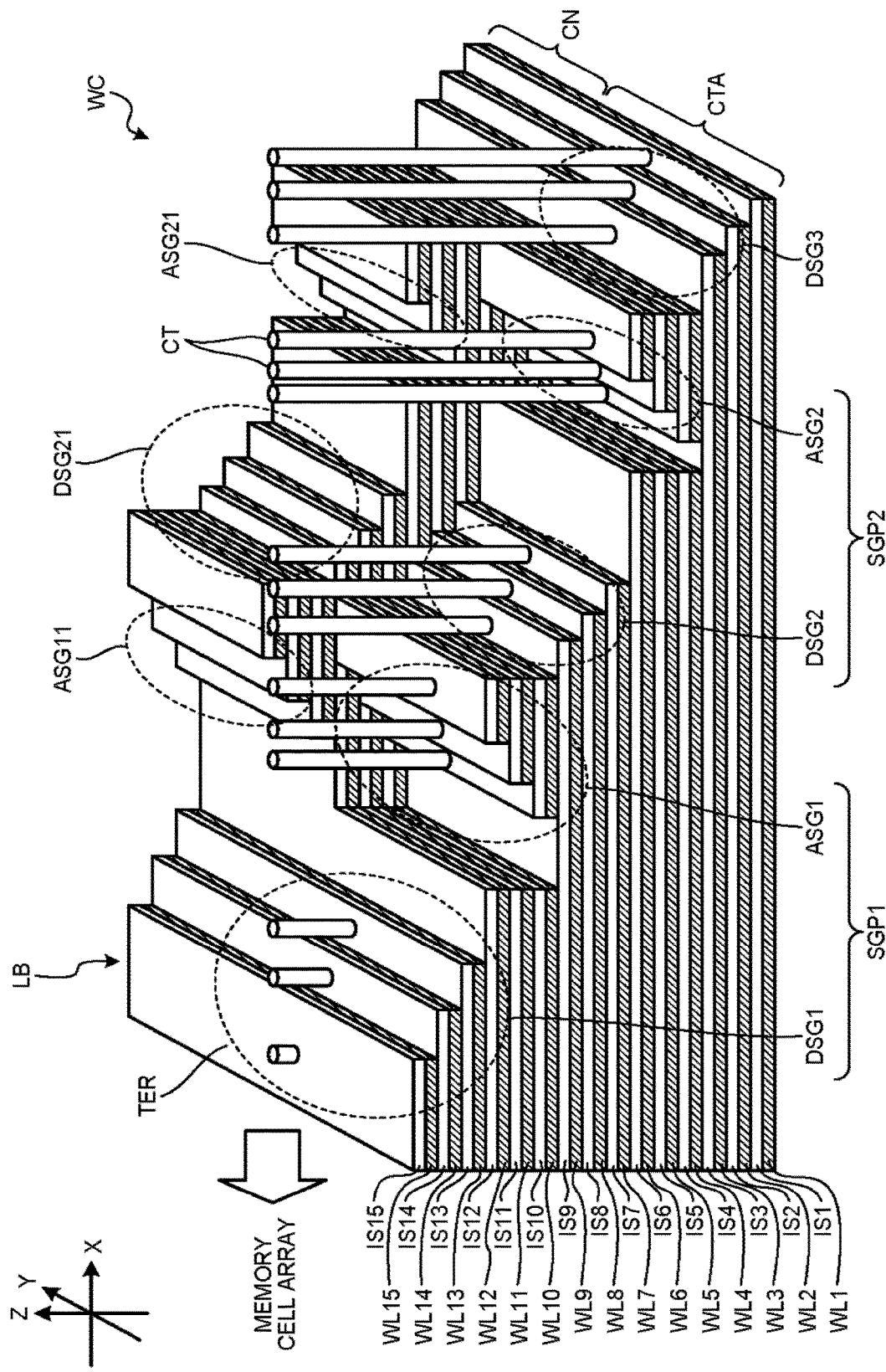
FIG. 2 is a perspective view schematically illustrating a configuration example of a contact part in the nonvolatile memory according to the embodiment.

FIG. 2 is a perspective view schematically illustrating a configuration example of the contact part in the nonvolatile memory according to the embodiment. Here, FIG. 2 omits illustration of the substrate Sub and so forth below the stacked body LB. Hereinafter, the word lines WL and the selection gate lines SGS and SGD may be referred to as "word lines WL", a a whole, without distinction. The memory cell array MA and the contact part WC are isolated from each other by a plurality of slits extending in the X-direction. FIG. 2 illustrates a configuration in which the contact part WC is isolated by adjacent two slits (not illustrated).

The contact part WC is arranged on the positive side of the X-direction outside the memory cell array MA. The contact part WC is configured such that staircase structures are formed on a stacked body LB in which a plurality of sets of a word line WL and an insulating layer IS arranged on the word line WL are stacked in the Z-direction. FIG. 2 illustrates an example in which the stacked body LB is formed of fifteen stacked layers each consisting of a set of a word line WL and an insulating layer IS. Hereinafter, when the word lines WL and the insulating layers IS need distinction, the sets of a word line WL and an insulating layer IS are given numbers from 1 in order from the lowermost side, and are expressed in the form of a word line WLi and an insulating layer ISi (i=1 to 15).

Each set of a word line WL and an insulating layer IS arranged thereon serves as a unit layer that forms each of the steps of the staircase structures. Each of the steps includes a terrace portion TER as a contact arrangement face, which is formed of the insulating layer IS.

The contact part WC includes a contact arrangement part CTA and a connection part CN. In this example, the contact arrangement part CTA is arranged on the negative direction side from about the center of the contact part WC in the Y-direction, and the connection part CN is arranged on the positive direction side from about the center in the Y-direction. The contact arrangement part CTA will also be referred to as "staircase contact region", and the connection part CN will also be referred to as "staircase connection region".

In the contact arrangement part CTA, contacts CT are arranged on the terrace portions TER of the respective steps. The contact arrangement part CTA includes a plurality of descending step groups DSG1 to DSG3, each of which is formed of steps descending in a direction (X-positive direction) away from the memory cell array MA in the X-direction, and a plurality of ascending step groups ASG1 and ASG2, each of which is formed of steps ascending in this direction. Each of the descending step groups DSG1 to DSG3 may also be referred to as "descending step contact region", and each of the ascending step groups ASG1 and ASG2 may also be referred to as "ascending step contact region". The connection part CN provides electrical connection for the respective word lines WL of the ascending step groups ASG1 and ASG2, which are divided in the contact arrangement part CTA.

In the example illustrated in FIG. 2, the contact arrangement part CTA includes the descending step group DSG1, the ascending step group ASG1, the descending step group DSG2, the ascending step group ASG2, and the descending step group DSG3 in this order in a direction (X-positive direction) away from the memory cell array MA in the X-direction. Here, each of the step groups DSG1 to DSG3, ASG1, and ASG2 includes three steps. However, the number of steps in each of the step groups is arbitrary.

The respective word lines WL composing the descending step groups DSG1 to DSG3 are continuously formed without being divided in the zone from the terrace portions TER to the memory cell array MA. Accordingly, the contacts CT arranged on the terrace portions TER of the respective word lines WL composing the descending step groups DSG1 to DSG3 are electrically connected to the corresponding word lines WL of the memory cells MC.

On the other hand, in the contact arrangement part CTA, the respective word lines WL composing the ascending step groups ASG1 and ASG2 are divided in the zone from the terrace portions TER to the memory cell array MA. Accordingly, when the contact arrangement part CTA is considered only by itself, the contacts CT arranged on the terrace portions TER of the respective word lines WL composing the ascending step groups ASG1 and ASG2 are not electrically connected to the corresponding word lines WL of the memory cells MC.

In consideration of the above, according to this embodiment, the word lines WL of the ascending step groups ASG1 and ASG2 thus divided are connected by the connection part CN, so that the contacts CT arranged on the terrace portions TER of the respective word lines WL composing the ascending step groups ASG1 and ASG2 are electrically connected to the corresponding word lines WL of the memory cells MC.

Specifically, each layer of the word lines WL composing the ascending step groups ASG1 and ASG2 is arranged in the adjacent connection part CN, without being divided in the zone from the corresponding terrace portion TER to the memory cell array MA. As long as this condition is satisfied, the connection part CN can be formed in any structure. In the example of FIG. 2, staircase structures are formed also on the connection part CN. However, the connection part CN may be formed of a stacked body of the word lines WL and the insulating layers IS that has no staircase structures.

In the contact arrangement part CTA of the example of FIG. 2, the descending step group DSG1 includes terrace portions TER formed of insulating layers IS15 to IS13, the ascending step group ASG1 includes terrace portions TER formed of insulating layers IS12 to IS10, the descending step group DSG2 includes terrace portions TER formed of insulating layers IS9 to IS7, the ascending step group ASG2 includes terrace portions TER formed of insulating layers IS6 to IS4, and the descending step group DSG3 includes terrace portions TER formed of insulating layers IS3 to IS1. The terrace portions TER of each of the step groups DSG1 to DSG3, ASG1, and ASG2 are arranged not to overlap with each other. Specifically, in the contact arrangement part CTA, the staircase structures are formed such that the descending step groups and the ascending step groups are arranged alternately one by one in the X-positive direction from the arrangement region of the memory cell array MA. Further, here, the uppermost steps of the descending step groups or the ascending step groups become sequentially lower by the height of three unit layers, in the X-positive direction from the arrangement region of the memory cell array MA.

Further, in the connection part CN, the descending step groups DSG1 and DSG3 are common to the contact arrangement part CTA. However, here, an ascending step group ASG11 includes terrace portions TER formed of the insulating layers IS15 to IS13, a descending step group DSG21 includes terrace portions TER formed of the insulating layers IS12 to IS10, and an ascending step group ASG21 includes terrace portions TER formed of the insulating layers IS9 to IS7.

As described above, in the connection part CN, the ascending step groups ASG11 and ASG21 are set higher than the ascending step groups ASG1 and ASG2 of the contact arrangement part CTA by the height corresponding to the number of steps in each of the step groups DSG1 to DSG3, ASG1, and ASG2, i.e., three unit layers. Consequently, the word lines WL, composing the ascending step groups ASG1 and ASG2 of the contact arrangement part CTA are connected to those word lines WL of the connection part CN which have continuous shapes between the terrace portions TER and the memory cell array MA.

Here, the contact arrangement part CTA is provided with one or more pairs of step groups, in each of which a descending step group formed of steps descending in the X-positive direction and an ascending step group formed of steps ascending in the X-positive direction are arranged in this order in the X-positive direction from the memory cell array MA. In each pair of step groups, the position of the uppermost step of the ascending step group is set lower than the position of the uppermost step of the descending step group by the height of unit layers corresponding to the number of steps in the descending step group. The pair of step groups may also be referred to as "contact group pair".

In the example of FIG. 2, the contact arrangement part CTA includes a step group pair SGP1 formed of the descending step group DSG1 and the ascending step group ASG1, a step group pair SGP2 formed of the descending step group DSG2 and the ascending step group ASG2, and the descending step group DSG3. The step group pair SGP2 is arranged on the X-positive direction side from the step group pair SGP1. The uppermost terrace portion TER of the step group pair SGP2 is lower than the lowermost terrace portion TER of the step group pair SGP1 by the height of one step. Here, the number of steps in each step group and the number of step group pairs are set in accordance with the number of stacked unit layers.

Figure 3:
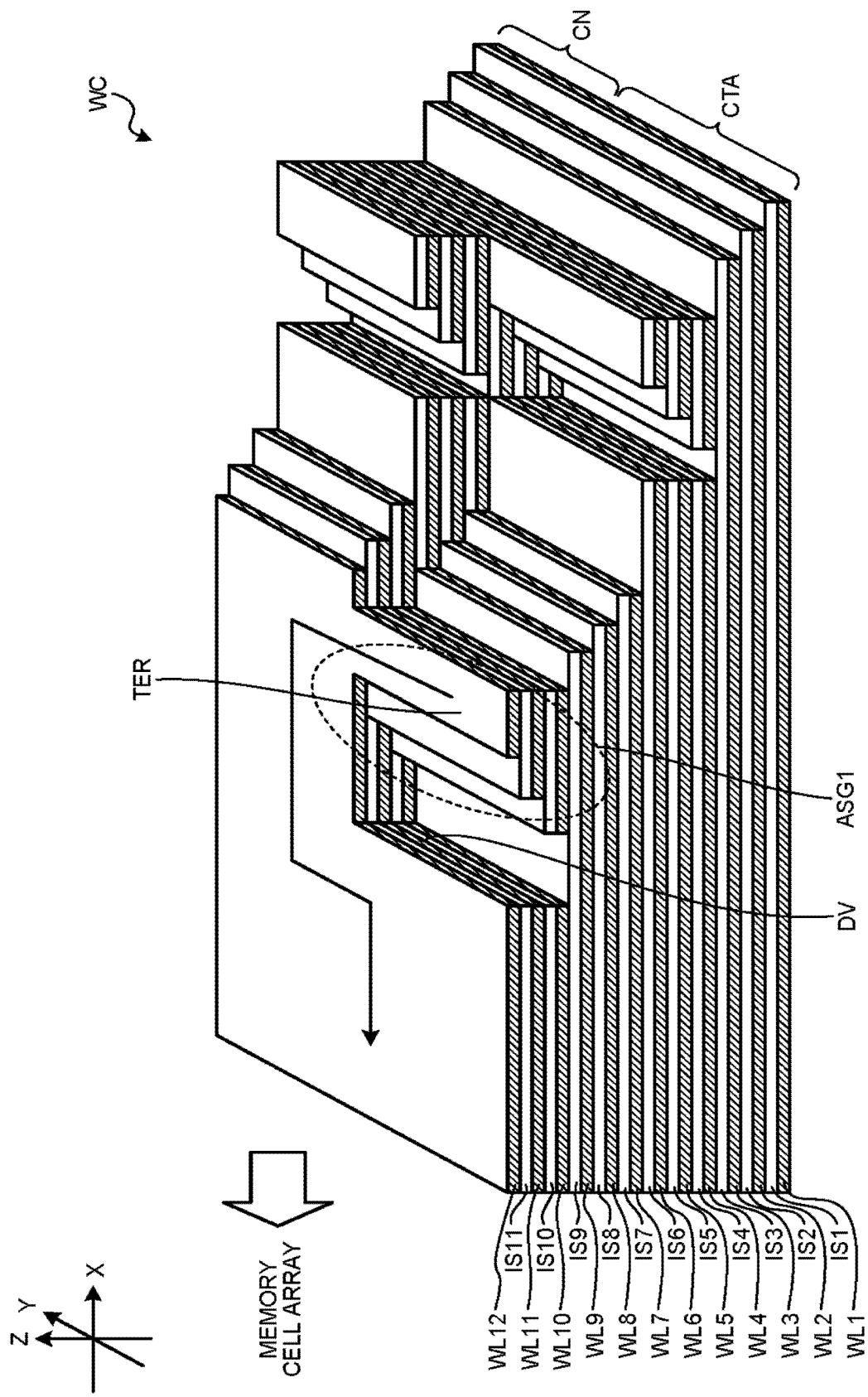
FIG. 3 is a diagram schematically illustrating a state of an electric current flowing in an ascending step group in the contact part according to the embodiment.

FIG. 3 is a diagram schematically illustrating a state of an electric current flowing in an ascending step group in the contact part according to the embodiment. FIG. 3 omits illustration of the word lines WL15 to WL13 and the insulating layer IS15 to IS12, and illustrates a state where the word line WL12 is exposed. As illustrated in FIG. 3, the word line WL12 of the ascending step group ASG1 present in the contact arrangement part CTA is divided by a dividing portion DV from the word line WL12 on the X-negative direction side. Accordingly, when the contact arrangement part CTA is considered only by itself, electrical connection to the corresponding memory cell MC is not provided in this state. However, in the connection part CN, the word line WL12 is formed continuously between the corresponding position in the ascending step group ASG1 and the memory cell MC, and this word line WL12 is in a state connected to the word line WL12 of the contact arrangement part CTA. Accordingly, the word line WL12 ensures electrical connection between the memory cell MC and the corresponding contact CT (not illustrated), as indicated by an arrow in FIG. 3. Here, an explanation has been given of the word line WL12 of the ascending step group ASG1; however, every word line WL included in the ascending step groups ensures electrical connection between a memory cell MC and a contact CT arranged on the ascending step groups, in the same way. With this structure, contacts CT can be arranged also in the ascending step groups, which are conventionally not used for arrangement of contacts CT.

Next, an explanation will be given of a manufacturing method of the contact part WC in the nonvolatile memory described above. FIGS. 4A to 11B are diagrams illustrating an example of procedures of a manufacturing method of a semiconductor memory device according to the embodiment. Here, FIGS. 4A, 5A, 6A, 7A, 8A, 9A, 10A, and 11A are top views, and FIGS. 4B, 5B, 6B, 7B, 8B, 9B, 10B, and 11B are sectional views taken along a line A-A of FIGS. 4A, 5A, 6A, 7A, 8A, 9A, 10A, and 11A, respectively. Here, these figures illustrate procedures of a manufacturing method of the contact part WC. Further, in this example, a case is illustrated where the height difference given by each step is formed of one unit layer.

First, as illustrated in FIG. 4B, on a substrate Sub with an insulating film INS formed thereon, a stacked body LB is formed by stacking a plurality of unit layers each consisting of a set of a sacrificial layer SAC and a insulating layer IS. The substrate Sub is formed of a semiconductor substrate, such as a silicon substrate. Further, the substrate Sub may be provided with memory cells and/or a peripheral circuit formed thereon.

The stacked body LB is formed of fifteen sacrificial layers SAC1 to SAC15 and fifteen insulating layers IS1 to IS15, for example. The sacrificial layers SAC1 to SAC15 are made of a material different in type from that of the insulating layers IS1 to IS15, and are used as layers to be replaced with conductive layers serving as word lines WL1 to WL15 later. For example, the insulating film INS and the insulating layers IS1 to IS15 are made of silicon oxide or the like, and the sacrificial layers SAC1 to SAC15 are made of silicon nitride or the like.

Then, as illustrated in FIGS. 4A and 4B, a resist is applied onto the stacked body LB, and a resist pattern 111 is formed by performing a light-exposure process and a development process. In the contact part WC, the resist pattern 111 is formed to cover the positions for forming ascending step groups and descending step groups. In this example, the resist pattern 111 includes two island-shaped parts formed in the contact part WC. Further, the resist pattern 111 includes a part formed on the arrangement region of a memory cell array MA.

Thereafter, as illustrated in FIGS. 5A and 5B, a predetermined number of steps are formed by alternately performing etching and slimming. For example, the exposed portions of the insulating layer IS15 and the sacrificial layer SAC15 are etched by using an etching technique, such as a Reactive Ion Etching (RIE) method, through the resist pattern 111 as a mask. Thereafter, the resist pattern 111 is slimmed by isotropic etching from the end of each part of the resist pattern in the X-direction, by a degree corresponding to the width of each flat portion of the stepped structure. Then, the exposed portions of the insulating layer IS15 and the sacrificial layer SAC15 and the exposed portions of the insulating layer IS14 and the sacrificial layer SAC14 are etched by using an etching technique, through the slimmed resist pattern 111 as a mask. Then, the resist pattern 111 is further slimmed. This process is repeated by a predetermined number of times, and recesses 120 are thereby formed each of which includes steps arranged on its lateral sides opposed to each other in the X-direction. Here, the set of etching and slimming is repeated three times, and thus three steps are formed. Consequently, a descending step group DSG1 is formed in the contact part WC.

Then, as illustrated in FIGS. 6A and 6B, a resist is applied onto the stacked body LB with steps formed thereon, and a resist pattern 112 is formed by performing a light-exposure process and a development process. Here, the resist pattern 112 is formed such that the regions in the contact arrangement part CTA other than the region used as the descending step group DSG1 are exposed, and the regions in the connection part CN other than the region used as a descending step group DSG3 are covered.

Figure 7A:
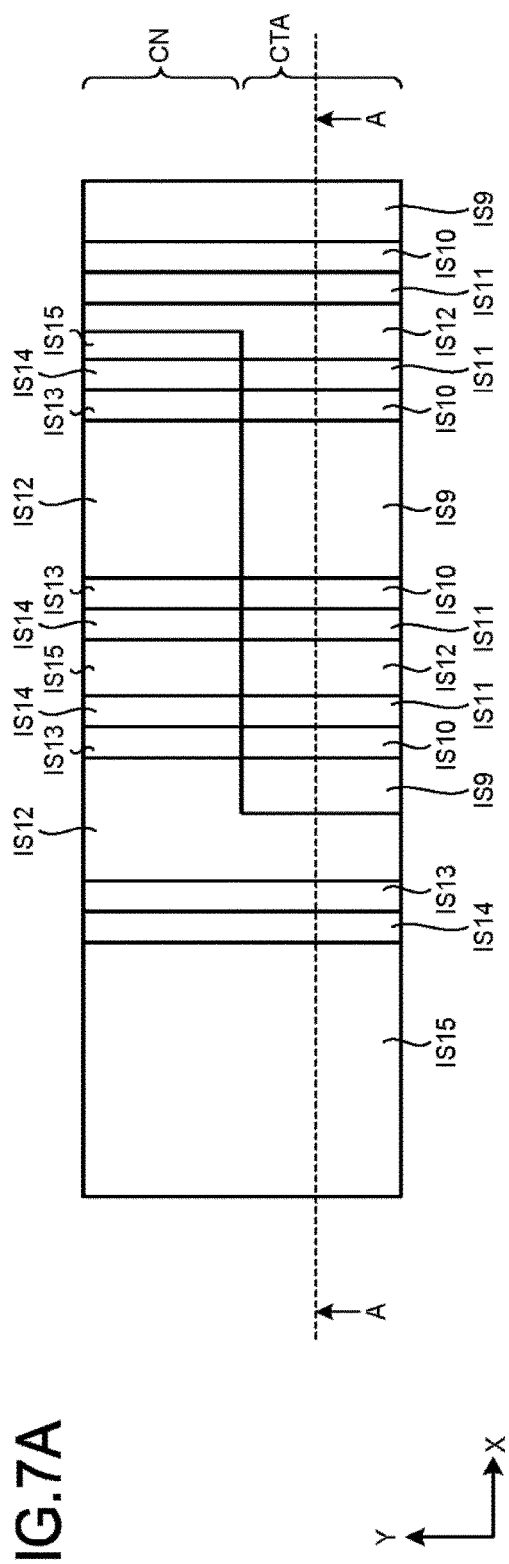
Figure 7B:
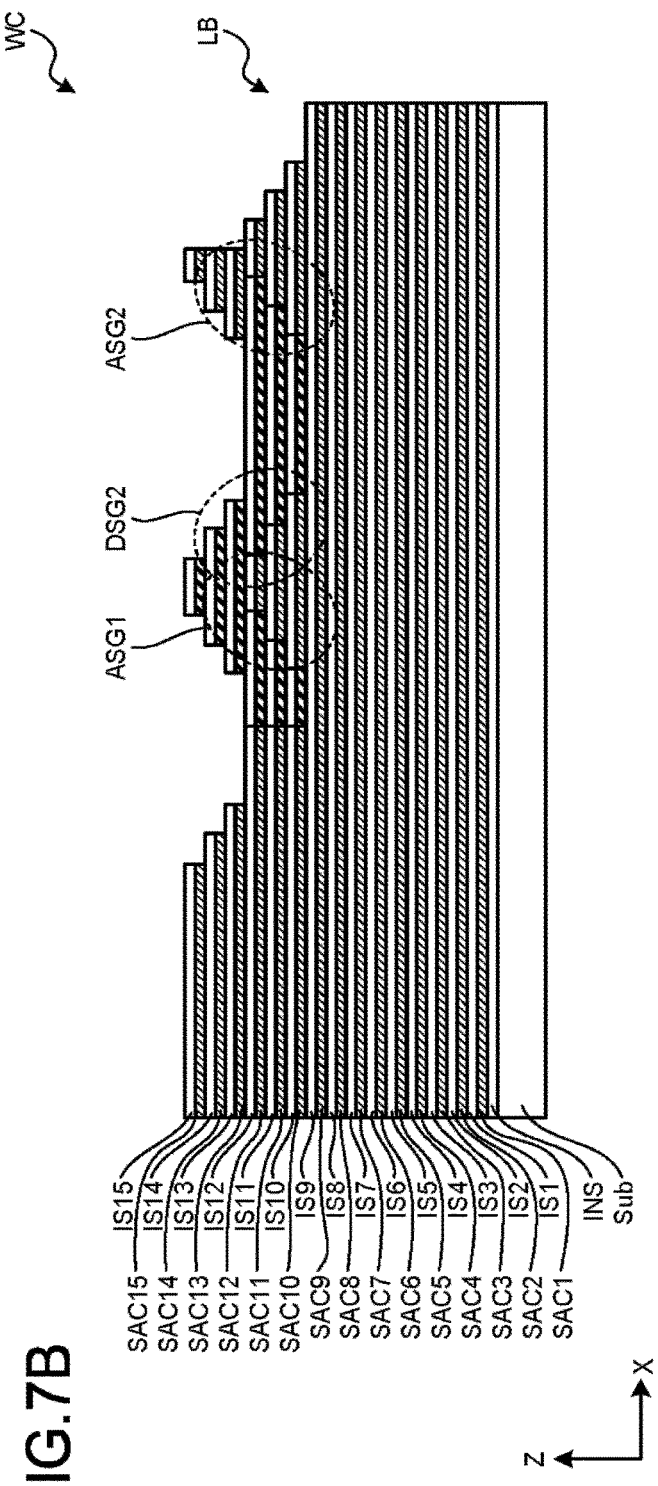

Thereafter, as illustrated in FIGS. 7A and 7B, a predetermined number of unit layers are etched by using an anisotropic etching technique, such as an RIE method, through the resist pattern 112 as a mask. This predetermined number is equal to the number of steps in each recess 120 formed in FIGS. 5A and 5B. Here, the recess 120 is formed by etching three unit layers, and thus is provided with three steps. In this process, the regions uncovered with the resist pattern 112 are etched to be lower than the descending step group DSG1 by a predetermined number of steps, and an ascending step group ASG1 is thereby formed in the contact arrangement part CTA.

With this process, the regions in the contact arrangement part CTA used as the ascending step group ASG1, a descending step group DSG2, and an ascending step group ASG2 become lower than the corresponding regions in the connection part CN by the height of three steps. Specifically, the sacrificial layers SAC10 to SAC12 processed in a stepwise state in the contact arrangement part CTA are in contact with the sacrificial layers SAC10 to SAC12 unprocessed in a stepwise state in the connection part CN, which are present at the same heights. With this height difference, the word lines WL of the ascending step group ASG1 can be electrically connected to the word lines WL of the corresponding memory cells in the memory cell array MA.

Then, as illustrated in FIGS. 8A and 8B, a resist is applied to the stacked body LB with steps formed thereon, and a resist pattern 113 is formed by performing a light-exposure process and a development process. Here, the resist pattern 113 is formed such that the region corresponding to the descending step group DSG2 and the region corresponding to the descending step group DSG3 are exposed.

Thereafter, as illustrated in FIGS. 9A and 9B, a predetermined number of unit layers are etched by using an anisotropic etching technique, such as an RIE method, through the resist pattern 113 as a mask. This predetermined number is equal to the number of steps in each recess 120 formed in FIGS. 5A and 5B, i.e., three steps here. In this process, the exposed regions are etched to be lower than the ascending step group ASG1 by a predetermined number of steps, and the descending step group DSG2 is thereby formed in the contact arrangement part CTA.

Then, as illustrated in FIGS. 10A and 10B, a resist is applied onto the stacked body LB with steps formed thereon, and a resist pattern 114 is formed by performing a light-exposure process and a development process. Here, the resist pattern 114 is formed such that the region corresponding to the ascending step group ASG2 and the region corresponding to the descending step group DSG3 are exposed.

Thereafter, as illustrated in FIGS. 11A and 11B, a predetermined number of unit layers are etched by using an anisotropic etching technique, such as an RIE method, through the resist pattern 114 as a mask. This predetermined number is equal to the number of steps in each recess 120 formed in FIGS. 5A and 5B, i.e., three steps here. In this process, the exposed regions are etched to be lower than the descending step group DSG2 by a predetermined number of steps, and the ascending step group ASG2 and the descending step group DSG3 are thereby formed in the contact arrangement part CTA.

Thereafter, although not illustrated, memory cells MC are formed in the memory cell array MA. For example, memory holes are formed extending through the stacked body LB in the thickness direction. Then, each of the memory holes is provided with a block insulating film, a charge accumulation film, a tunnel insulating film, and a channel semiconductor layer formed therein in this order. Further, each of the memory holes with the channel semiconductor layer formed therein is filled with a core insulating layer, by which a pillar film is formed. Thereafter, slits are formed in the stacked body including the memory cell array MA and the contact part WC, in a state extending in the X-direction and arranged at predetermined intervals in the Y-direction. The block insulating film, the charge accumulation film, and the tunnel insulating film compose a multilayer film. Then, the sacrificial layers SAC1 to SAC15 are removed by isotropic etching, and gaps are thereby formed between respective ones of the insulating film INS and the insulating layers IS1 to IS15 adjacent to each other in the Z-direction. Thereafter, the gaps are filled with conductive layers serving as word lines WL1 to WL15, and a nonvolatile memory 10 is thereby formed.

Here, the figures illustrate a case where the dimension of the connection part CN in the Y-direction is almost the same as the dimension of the contact arrangement part CTA in the Y-direction. However, this is a mere example, to which the embodiment is not limited. As long as an electric current is allowed to flow between the contacts CT and the memory cells MC, the dimension of the connection part CN in the Y-direction can be set arbitrarily. For example, the dimension of the connection part CN in the Y-direction may be set smaller than the dimension of the contact arrangement part CTA in the Y-direction, to reduce the area of the nonvolatile memory 10 in the X-direction and the Y-direction.

In the example described above, the contact part WC includes steps ascending and steps descending in the X-direction. However, the contact part WC may further include steps ascending and steps descending in the Y-direction.

Figure 12:
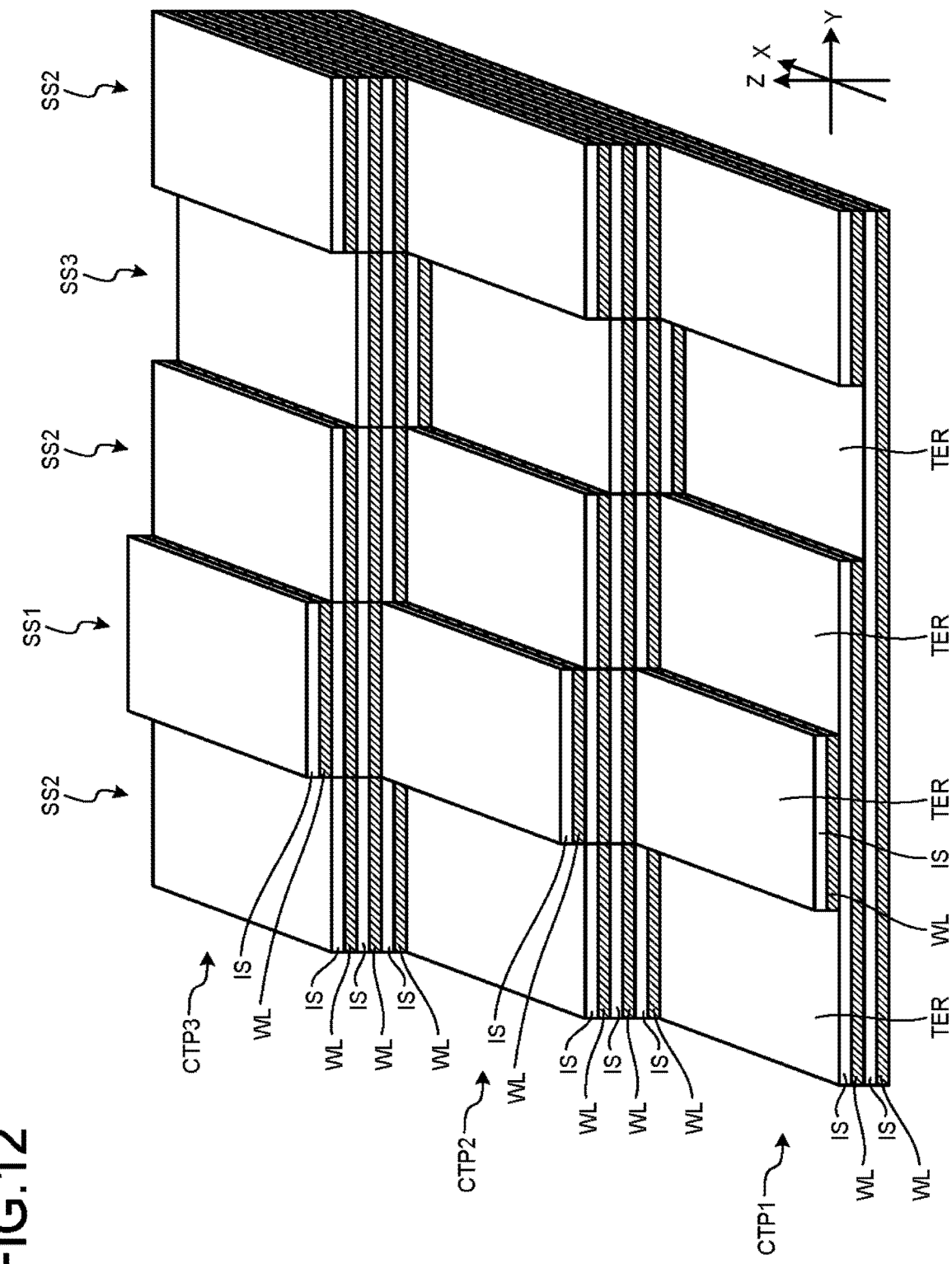
FIG. 12 is a diagram illustrating an example of a contact part that includes steps ascending and steps descending in an X-direction and a Y-direction.
Figure 13:
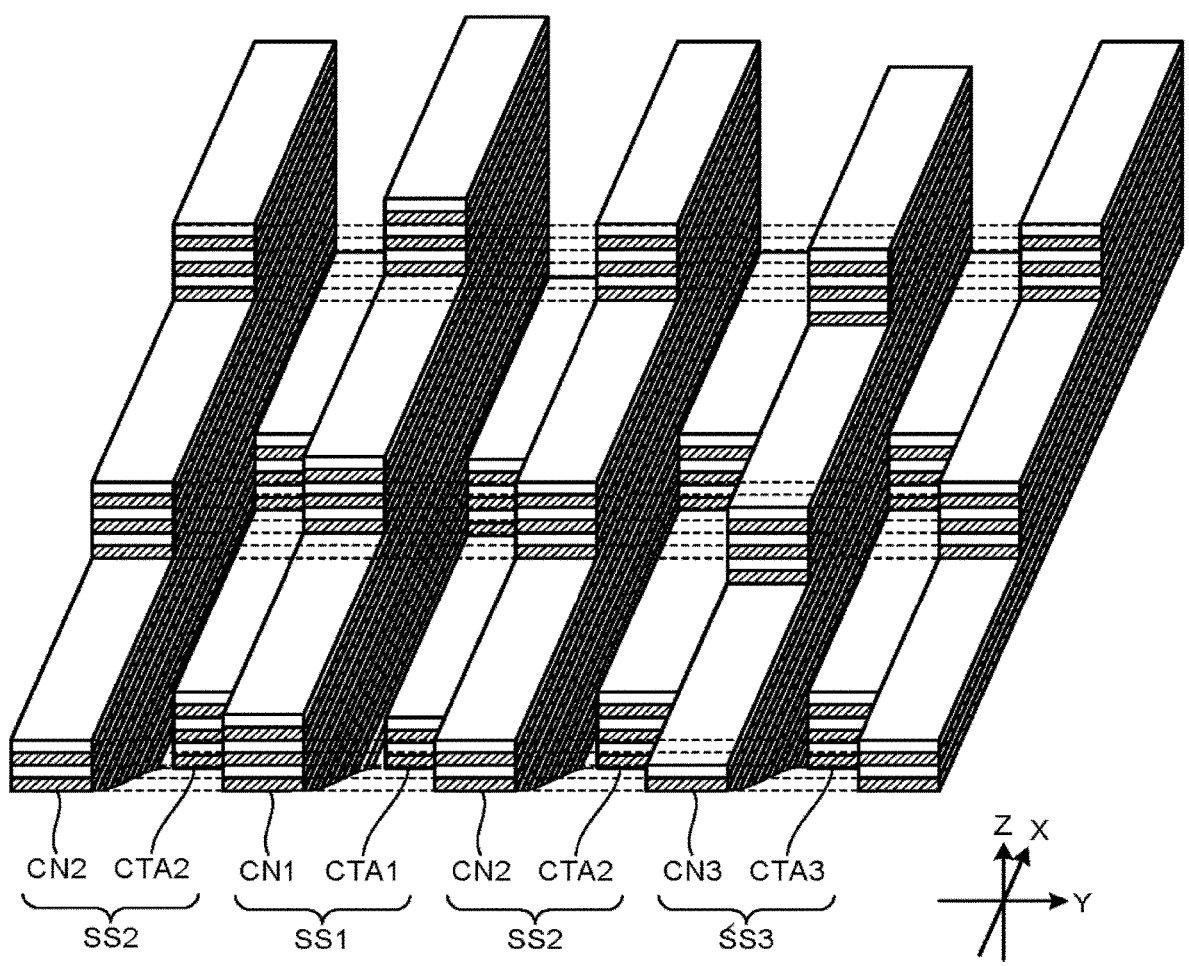
FIG. 13 is a diagram illustrating another example of a contact part that includes steps ascending and steps descending in the X-direction and the Y-direction, according to the embodiment.

FIG. 12 is a diagram illustrating an example of a contact part that includes steps ascending and steps descending in the X-direction and the Y-direction. FIG. 13 is a diagram illustrating another example of a contact part that includes steps ascending and steps descending in the X-direction and the Y-direction, according to the embodiment. Each of FIGS. 12 and 13 illustrates some steps extracted from the descending step groups and/or the ascending step groups of FIG. 2, for example.

In the contact part illustrated in FIG. 12, the number of unit layers composing each step in the X-direction is N (N is an integer of 2 or more). Further, each of the contact arrangement faces CTP1 to CTP3 of steps descending or ascending in the X-direction is provided periodically with an (N−1)-number of steps descending in the Y-direction and an (N−1)-number of steps ascending in the Y-direction. With this arrangement, the respective unit layers composing each step in the X-direction form terrace portions TER, which are the flat portions of the staircase structures in the Y-direction. Each of the terrace portions TER comes to be provided with a contact.

In the case of FIG. 2, as the number of unit layers composing each step in the X-direction is one, the contact arrangement face (terrace portion TER) of each step is provided with one contact CT. Thus, where xc denotes the dimension of the contact arrangement face in the X-direction, and M denotes the number of unit layers, the dimension of the contact part WC in the X-direction becomes "xc×M", at least.

On the other hand, in the case of FIG. 12, the number of unit layers composing each step in the X-direction is N, and each of the contact arrangement faces CTP1 to CTP3 of the steps in the X-direction is provided with an N-number of terrace portions TER by an (N−1)-number of steps in the Y-direction. Consequently, each of the contact arrangement faces CTP1 to CTP3 of the steps in the X-direction is provided with an N-number of contacts. Accordingly, the dimension of the contact part WC in the X-direction becomes "xc×M/N", at least, and thus, as compared with the case of FIG. 2, the dimension of the contact part WC in the X-direction can be smaller to 1/N.

In the example illustrated in FIG. 12, the number of unit layers per step of the stepped structure formed in the X-direction is three, and each of the contact arrangement faces CTP1 to CTP3 of the stepped structure formed in the X-direction is provided with staircase structures each including two steps in the Y-direction.

The formation described above may be applied also to the contact part WC having the configuration illustrated in FIG. 2. The contact part WC of FIG. 12 can be deemed as a configuration formed such that staircase structures in the X-direction, which are the same in height difference but different in height, are arrayed in the Y-direction. In the example of FIG. 12, there are three types of staircase structures SS1 to SS3 in the X-direction. FIG. 13 illustrates a case where each of the staircase structures SS1 to SS3 is provided with a contact arrangement part CTA and a connection part CN.

As illustrated in FIG. 13, staircase structures SS1 to SS3 include contact arrangement parts CTA1 to CTA3 and connection parts CN1 to CN3. The ascending step groups of the contact arrangement parts CTA1 to CTA3 are set lower than the ascending step groups of the connection parts CN1 to CN3 by the height of the number of unit layers composing each step of the ascending step groups. Consequently, the respective word lines WL of the ascending step groups are electrically connected to the word lines WL of the memory cell array MA.

A manufacturing method of this contact part WC is substantially the same as that illustrated in FIGS. 4A to 11B. However, the etching in the above description is performed such that the number of unit layers composing each step in the X-direction is one, while the etching in this case is performed such that the number of unit layers for the same is N. Further, the steps in the Y-direction are provided by forming a resist pattern including parts on the respective contact arrangement faces of the stacked body LB, and repeating the set of etching and slimming, after FIGS. 5A and 5B and before FIGS. 6A and 6B. In this case, the etching is performed such that the number of unit layers composing each step in the Y-direction is one.

In this embodiment, the contact part WC has a configuration including the contact arrangement part CTA and the connection part CN. The contact arrangement part CTA includes the descending step groups DSG1 and DSG2, and the ascending step groups ASG1 and ASG2 arranged adjacent to the descending step groups DSG1 and DSG2, respectively, in a direction away from the memory cell array MA. Each of the descending step groups DSG1 and DSG2 is formed of steps descending in the X-positive direction, while each of the ascending step groups ASG1 and ASG2 is formed of steps ascending in the X-positive direction. The connection part CN connects the word lines WL composing the ascending step groups ASG1 and ASG2 to the memory cells MC present at the same heights. Consequently, contacts CT can be arranged also in the ascending step groups ASG1 and ASG2, which are conventionally not used for arrangement of contacts CT and thus are left as dead spaces. As a result, an effect is obtained to reduce the dimension of the contact part WC in the X-direction, as compared with the conventional configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising a memory cell array region and a contact region, wherein
   the semiconductor memory device further comprises conductive layers stacked at intervals and extending from the memory cell array region to the contact region,
   the contact region includes a staircase contact region and a staircase connection region,
   the staircase contact region includes one or more contact group pairs, each pair including:
      a descending step contact region with steps descending in a first direction away from the memory cell array region; and
      an ascending step contact region with steps ascending in the first direction, the ascending step contact region being provided adjacent to the paired descending step contact region in the first direction;
   in each of the one or more contact group pairs, the conductive layer of an uppermost step in the ascending step contact region is lower in a stacking position than the conductive layer of a lowermost step in the paired descending step contact region, the descending step contact region and the ascending step contact region include terrace faces, each terrace face being provided for each step and being connected to a different contact member, the contact region further includes an in-between step between a lowermost step in the descending step contact region and a lowermost step in the paired ascending step contact region, the in-between step descending in the first direction from a flat portion on the conductive layer lower than the lowermost step in the descending step contact region, the conductive layer of the flat portion being equal in a stacking position to an uppermost step in the paired ascending step contact region, and the staircase connection region includes conductive layers formed of layers same as conductive layers connected to the contact members of the ascending step contact region.

2. The semiconductor memory device according to claim 1, wherein the one or more contact group pairs are two or more contact group pairs, and the two or more contact group pairs are arranged in the first direction away from the memory cell array region.

3. The semiconductor memory device according to claim 1, wherein each step of the descending step contact region and the ascending step contact region is composed of a unit layer including a set of one conductive layer and one insulating layer.

4. The semiconductor memory device according to claim 3, wherein, at a position in the staircase connection region corresponding to the ascending step contact region, another ascending step group having a shape same as that of the ascending step contact region is formed on the unit layers higher than the ascending step contact region by a height corresponding to a number of steps of the ascending step contact region.

5. The semiconductor memory device according to claim 1, wherein the ascending step contact region and the descending step contact region include, for each terrace face, one or more steps descending and/or ascending in a second direction orthogonal to the first direction.

6. The semiconductor memory device according to claim 5, wherein each step of the descending step contact region and the ascending step contact region in the first direction is composed of an N-number of unit layers (N is an integer of 2 or more), each of the unit layers including a set of one conductive layer and one insulating layer, and a number of the one or more steps in the second direction are N−1.

7. The semiconductor memory device according to claim 1, wherein the memory cell array region includes a pillar portion extending in a stacking direction through the conductive layers stacked, a channel layer provided on a lateral side of the pillar portion, and a multi-layer film provided on the channel layer.

8. The semiconductor memory device according to claim 1, wherein the staircase connection region is smaller than the staircase contact region in size in a second direction orthogonal to the first direction.

9. The semiconductor memory device according to claim 1, wherein the flat portion of the in-between step is connected to no contact member.

10. A semiconductor memory device comprising a memory cell array region including first to fourth conductive layers, and a contact part including the first to fourth conductive layers, wherein the second conductive layer is arranged above the first conductive layer, the third conductive layer is arranged above the second conductive layer, the fourth conductive layer is arranged above the third conductive layer, the contact part includes a descending step group including the third and fourth conductive layers, an ascending step group including the first and second conductive layers, and a connection part including the first and second conductive layers, the descending step group is formed of steps descending, from the fourth conductive layer as uppermost step, in a first direction away from the memory cell array region, the ascending step group is provided adjacent to the descending step in the first direction and is formed of steps ascending, from the first conductive layer as a lowermost step, in the first direction away from the memory cell array region, the descending step group and the ascending step group include terrace faces, each terrace face being provided for each step and being connected to a different contact member, the contact part further includes an in-between step between a lowermost step in the descending step group and a lowermost step in the ascending step group, the in-between step descending in the first direction from a flat portion on the conductive layer lower than the lowermost step in the descending step group, the conductive layer of the flat portion being equal in a stacking position to an uppermost step in the ascending step group, the first conductive layer of the ascending step group is connected to the first conductive layer of the connection part, and the second conductive layer of the ascending step group is connected to the second conductive layer of the connection part.

11. The semiconductor memory device according to claim 10, wherein the contact part includes two or more step group pairs that are arranged in the first direction away from the memory cell array region, each of the step group pairs including the descending step group and the ascending step group being arranged adjacent to the descending step group in the first direction.

12. The semiconductor memory device according to claim 10, wherein each step of the descending step group and the ascending step group is composed of a unit layer including a set of one conductive layer and one insulating layer.

13. The semiconductor memory device according to claim 12, wherein, at a position in the connection part corresponding to the ascending step group, another ascending step group having a shape same as that of the ascending step group is formed on the unit layers higher than the ascending step group by a height corresponding to a number of steps of the ascending step group.

14. The semiconductor memory device according to claim 10, wherein the ascending step group and the descending step group include, for each terrace face, one or more steps descending and/or ascending in a second direction orthogonal to the first direction.

15. The semiconductor memory device according to claim 14, wherein
each step of the descending step group and the ascending step group in the first direction is composed of an N-number of unit layers (N is an integer of 2 or more), each of the unit layers including a set of one conductive layer and one insulating layer, and
a number of the one or more steps in the second direction are N−1.

16. The semiconductor memory device according to claim 10, wherein the memory cell array region includes
a pillar portion extending in a stacking direction through the conductive layers stacked,
a channel layer provided on a lateral side of the pillar portion, and
a multi-layer film provided on the channel layer.

17. The semiconductor memory device according to claim 10, wherein the connection part is smaller, than a part including the descending step group and the ascending step group, in size in a second direction orthogonal to the first direction.

18. The semiconductor memory device according to claim 10, wherein the flat portion of the in-between step is connected to no contact member.

19. A manufacturing method of a semiconductor memory device, the method comprising:
forming a stacked body by stacking unit layers each formed of a set of a first layer and a second layer;
forming one or more contact group pairs in a first region of the stacked body by processing the unit layers from an uppermost layer to an "n"-th layer ("n" is an integer of 2 or more), each pair including a descending step group and an ascending step group, the descending step group including an "a"-number of steps ("a" is an integer of 1 or more and "n" or less) descending in a first direction away from a memory cell array formation region, the ascending step group including an "a"-number of steps ascending in the first direction, wherein, in each of the one or more contact group pairs, the unit layer of an uppermost step in the ascending step group is lower in a stacking position than the unit layer of a lowermost step in the paired descending step group, and an in-between step is formed between a lowermost step in the descending step group and a lowermost step in the paired ascending step group, the in-between step descending in the first direction from a flat portion on a conductive layer lower than the lowermost step in the descending step group, the conductive layer of the flat portion being equal in a stacking position to an uppermost step in the paired ascending step group; and
processing the stacked body in a second region, which is adjacent to the first region in a direction intersecting with the first direction and a stacking direction of the unit layers, such that the first region is lower than the second region by a height of an "n"-number of layers of the unit layers.

20. The manufacturing method according to claim 19, wherein,
the one or more contact group pairs are two or more contact group pairs, and
in processing the stacked body, the stacked body is processed such that positions of uppermost steps of each of the two or more contact group pairs become sequentially lower by a height of an "n"-number of layers of the unit layers, in the first direction away from the memory cell array formation region.

21. The manufacturing method according to claim 19, wherein each step of the descending step group and the ascending step group is composed of one layer of the unit layers.

22. The manufacturing method according to claim 19, wherein the second region is smaller than the first region in size in a second direction orthogonal to the first direction.

* * * * *